United States Patent
Hokazono et al.

(10) Patent No.: US 10,411,691 B2
(45) Date of Patent: Sep. 10, 2019

(54) SEMICONDUCTOR DEVICE DRIVING CIRCUIT

(71) Applicant: Mitsubishi Electric Corporation, Tokyo (JP)

(72) Inventors: Kazuya Hokazono, Tokyo (JP); Akihisa Yamamoto, Tokyo (JP); Dong Wang, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 4 days.

(21) Appl. No.: 15/741,079

(22) PCT Filed: Dec. 10, 2015

(86) PCT No.: PCT/JP2015/084617
§ 371 (c)(1),
(2) Date: Dec. 29, 2017

(87) PCT Pub. No.: WO2017/098624
PCT Pub. Date: Jun. 15, 2017

(65) Prior Publication Data
US 2018/0205373 A1    Jul. 19, 2018

(51) Int. Cl.
*H03K 17/08*    (2006.01)
*H03K 17/0812*    (2006.01)
(Continued)

(52) U.S. Cl.
CPC ........ *H03K 17/08122* (2013.01); *H02M 1/08* (2013.01); *H03K 5/003* (2013.01);
(Continued)

(58) Field of Classification Search
CPC ........... H03K 17/08122; H03K 17/168; H03K 17/163; H03K 17/08128; H03K 5/003; H03K 2217/0027; H02M 1/08
(Continued)

(56) References Cited

U.S. PATENT DOCUMENTS 8,692,587 B1 *  4/2014  Dijk .................. H03K 17/06
                                                 326/83
8,885,310 B2 *  11/2014 Kandah .............. H03K 17/0826
                                                 327/434
(Continued)

FOREIGN PATENT DOCUMENTS

JP    2004-201486 A    7/2004
JP    2004-260981 A    9/2004
(Continued)

OTHER PUBLICATIONS

International Search Report (PCT/ISA/210) dated Feb. 16, 2016, from corresponding International Appl No. PCT/JP2015/084617, 1 pp.
(Continued)

*Primary Examiner* — Ryan Jager
(74) *Attorney, Agent, or Firm* — Studebaker & Brackett PC

(57) ABSTRACT

A semiconductor device driving circuit includes: a signal transmission circuit including a first level shift circuit, the signal transmission circuit and an unsaturated voltage detection circuit configured to output a first error signal when an unsaturated voltage of a semiconductor switching element driven by the drive signal is detected. The semiconductor device driving circuit generates a second error signal having the second voltage level by level-shifting the first error signal or a converted signal obtained by converting the first error signal into a pulse signal. The semiconductor device driving circuit further includes a soft shutdown circuit configured to change a drive signal for the semiconductor switching element to softly shut down the semiconductor switching element when the second error signal is input.

5 Claims, 10 Drawing Sheets

(51) Int. Cl.
*H02M 1/08* (2006.01)
*H03K 5/003* (2006.01)
*H03K 17/16* (2006.01)

(52) U.S. Cl.
CPC ..... *H03K 17/08128* (2013.01); *H03K 17/163* (2013.01); *H03K 17/168* (2013.01); *H03K 2217/0027* (2013.01)

(58) Field of Classification Search
USPC .......................................................... 327/108
See application file for complete search history.

(56) References Cited

U.S. PATENT DOCUMENTS

| | | | | |
|---|---|---|---|---|
| 8,913,352 | B2* | 12/2014 | Majarov | H02H 7/122 |
| | | | | 361/18 |
| 9,214,934 | B2* | 12/2015 | Cottell | H03K 17/0826 |
| 10,241,143 | B2* | 3/2019 | Park | G01R 31/025 |
| 2004/0120090 | A1* | 6/2004 | Galli | H02M 1/32 |
| | | | | 361/115 |
| 2018/0205373 | A1* | 7/2018 | Hokazono | H02M 1/08 |

FOREIGN PATENT DOCUMENTS

| | | |
|---|---|---|
| JP | 2005-006464 A | 1/2005 |
| JP | 2015-202034 A | 11/2015 |

OTHER PUBLICATIONS

International Preliminary Report on Patentability issued in corresponding International Application No. PCT/JP2015/084617; dated Jun. 21, 2018.

* cited by examiner

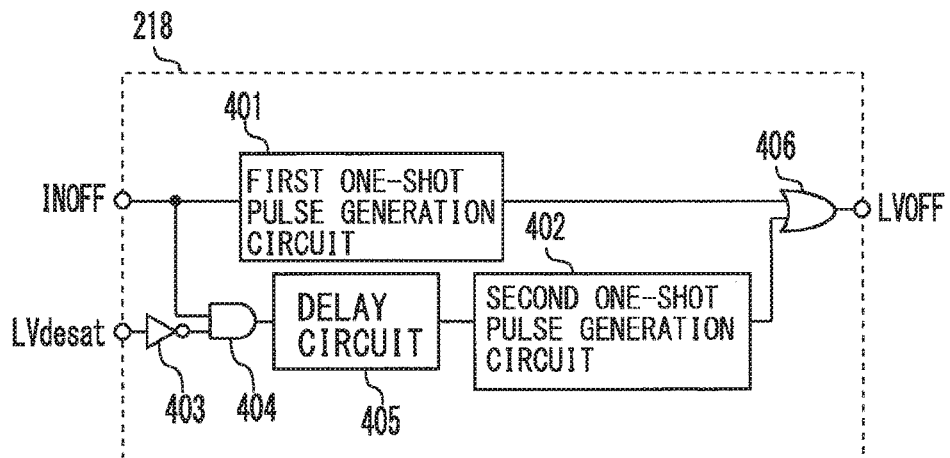

SEMICONDUCTOR DEVICE DRIVING CIRCUIT

FIELD

The present invention relates to a semiconductor device driving circuit.

BACKGROUND

For example, as disclosed in JP 2004-201486 A, a method for detecting unsaturation of a semiconductor switching element has been heretofore known as a short-circuit protection function for a high-potential-side semiconductor switching element. When the semiconductor switching element is in a normally ON state, a voltage between terminals of the semiconductor switching element is a saturated voltage. However, when the semiconductor switching element is in a short-circuited state, the voltage between terminals of the semiconductor switching element rises from the saturated voltage due to an overcurrent and then becomes an unsaturated voltage. JP 2004-201486 A described above discloses a technique for performing short-circuit protection for the high-potential-side semiconductor switching element by detecting an unsaturated voltage to detect a short-circuited state of the high-potential-side semiconductor switching element. Note that "unsaturated" may be abbreviated as "DESAT", and "unsaturated voltage" may be abbreviated as "DESAT voltage".

CITATION LIST

Patent Literature

[PTL 1] JP 2004-201486 A

SUMMARY

Technical Problem

A semiconductor device driving circuit is known in which a high-potential drive signal is generated by level-shifting an input signal input to a low potential side. A specific example of the circuit configuration of the semiconductor device driving circuit includes a level shift circuit, a primary-side circuit that is provided at a pre-stage of the level shift circuit and operates at a low voltage level, and a secondary-side circuit that is provided at a subsequent stage of the level shift circuit and operates at a high voltage level. When an input signal is input to the primary-side circuit, the input signal is level-shifted through the level shift circuit and a drive signal is output through the secondary-side circuit. The drive signal is supplied to a control terminal of a high-potential-side semiconductor switching element.

The way how to shut down a semiconductor switching element includes a hard shutdown and a soft shutdown. In the hard shutdown, the gate voltage of the semiconductor switching element is caused to rapidly fall to thereby rapidly shut down the semiconductor switching element. In the soft shutdown, the gate voltage of the semiconductor switching element is caused to slowly fall to thereby more slowly shut down the semiconductor switching element than in the hard shutdown. If the semiconductor switching element is rapidly shut down when the short-circuit protection is performed, an excessive surge is generated due to steep di/dt. To avoid this, it is preferable to perform soft shutdown rather than hard shutdown during short-circuit protection. In a normally-off operation of the semiconductor switching element based on the ON/OFF state of the drive signal, hard shutdown is performed. On the other hand, soft shutdown is an operation different from the normally-off operation, and a drive signal that slowly falls for soft shutdown is supplied from the secondary-side circuit to the high-potential-side semiconductor switching element.

The present inventor has intensively studied the technique for detecting an unsaturated voltage of a high-potential-side semiconductor switching element at the low potential side. If a circuit configuration for detecting an unsaturated voltage of a high-potential-side semiconductor switching element at a high potential side is employed, the high-potential-side semiconductor switching element may be shut down by treating error information indicating that the unsaturated voltage has been detected in the secondary-side circuit. However, in the circuit configuration for detecting the unsaturated voltage of the high-potential-side semiconductor switching element at the low potential side as studied by the present inventor, it is necessary to create a drive signal for soft shutdown after accurately transmitting the signal indicating the normally-off operation and the error information indicating that the unsaturated voltage has been detected, while distinguishing the signal and the error information from each other. The technique for detecting the unsaturated voltage of the high-potential-side semiconductor switching element at the low potential side has not been fully studied.

The present invention has been made to solve the above-mentioned problems, and an object of the present invention is to provide a semiconductor device driving circuit capable of appropriately performing short-circuit protection for a high-potential-side semiconductor switching element, while detecting an unsaturated voltage at a low potential side.

Solution to Problem

A semiconductor device driving circuit according to the present invention includes:

a signal transmission circuit including a first level shift circuit configured to level-shift an input signal having a first voltage level, the signal transmission circuit being configured to generate a drive signal having a second voltage level higher than the first voltage level based on the input signal; and an unsaturated voltage detection circuit configured to output a first error signal having the first voltage level when an unsaturated voltage of a semiconductor switching element driven by the drive signal is detected, wherein a second error signal having the second voltage level is generated by level-shifting the first error signal, or by a signal obtained by level-shifting a converted signal converted into a pulse signal from the first error signal, and wherein the semiconductor device driving circuit further comprises a soft shutdown circuit configured to change a drive signal for the semiconductor switching element to softly shut down the semiconductor switching element when the second error signal is input.

Advantageous Effects of Invention

According to the present invention, it is possible to create a drive signal for soft shutdown by generating an error signal, which indicates that an unsaturated voltage has been detected, at a low potential side, and by appropriately transmitting the error signal to a high potential side to activate a soft shutdown circuit. Consequently, short-circuit protection for a high-potential-side semiconductor switching element can be appropriately performed while the unsaturated voltage is detected at the low potential side.

BRIEF DESCRIPTION OF DRAWINGS

FIG. 8 is a circuit block diagram illustrating a part of the semiconductor device driving integrated circuit according to the third embodiment of the present invention;

FIG. 9 is a circuit block diagram illustrating a part of the semiconductor device driving integrated circuit according to the third embodiment of the present invention;

DESCRIPTION OF EMBODIMENTS

Figure 11:
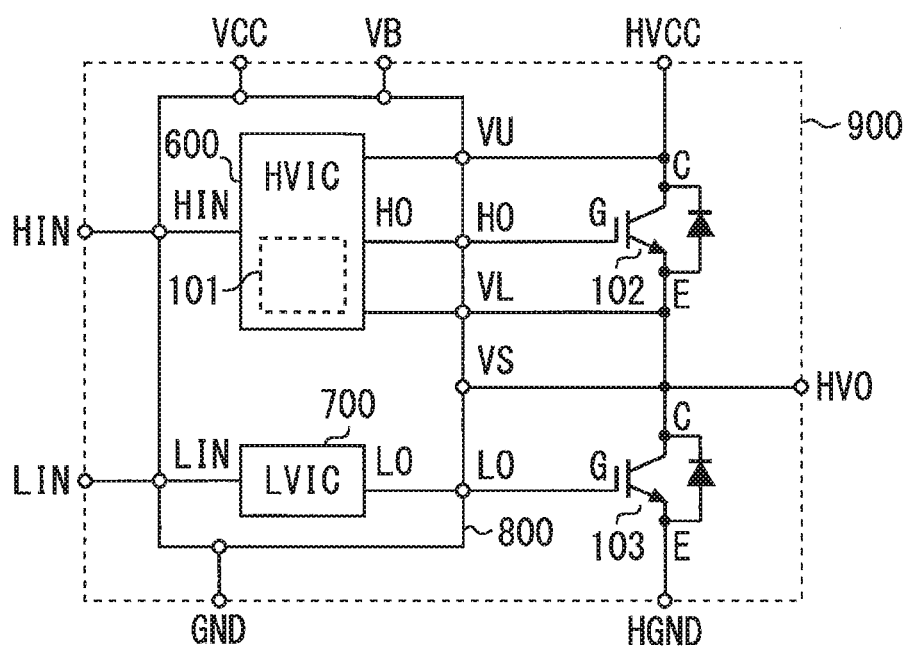
FIG. 11 is a diagram illustrating a semiconductor device to which semiconductor device driving integrated circuits according to each embodiment of the present invention are applied.

FIG. 11 is a diagram illustrating a semiconductor device to which semiconductor device driving integrated circuits 101 to 101b according to each embodiment of the present invention are applied. A semiconductor device 900 illustrated in FIG. 11 is also referred to as the inverter device 900. The inverter device 900 includes semiconductor switching elements 102 and 103 that are connected in series, and a drive module 800 that drives the semiconductor switching elements 102 and 103. In the embodiment, for example, insulated gate bipolar transistors (IGBTs) are used as the semiconductor switching elements 102 and 103, but instead other transistors such as a MOS field-effect transistor (MOSFET), may be used, and Si or SiC may be used as a material for the transistors.

The semiconductor switching element 102 is a high-potential-side semiconductor switching element (high-side switching element), and the semiconductor switching element 103 is a low-potential-side semiconductor switching element (low-side switching element). A collector electrode of the high-potential-side semiconductor switching element 102 is connected to a third power supply voltage HVCC, and an emitter electrode of the low-potential-side semiconductor switching element 103 is connected to a third reference potential HGND. A collector electrode of the low-potential-side semiconductor switching element 103 is connected to an emitter electrode of the high-potential-side semiconductor switching element 102.

The drive module 800 includes an HVIC 600 that outputs a drive signal HO for driving the high-potential-side semiconductor switching element 102, and an LVIC 700 that outputs a drive signal LO for driving the low-potential-side semiconductor switching element 103. The HVIC 600 incorporates the semiconductor device driving integrated circuit 101 illustrated in FIG. 1, and includes a terminal VU connected to the collector electrode of the high-potential-side semiconductor switching element 102, and a terminal VL connected to the emitter electrode of the high-potential-side semiconductor switching element 102. The HVIC 600 may incorporate the semiconductor device driving integrated circuit 101a illustrated in FIG. 3 or the semiconductor device driving integrated circuit 101b illustrated in FIG. 7, in place of the semiconductor device driving integrated circuit 101 illustrated in FIG. 1. According to the embodiment, the terminals VU and VL of the drive module 800 are respectively connected to a collector (drain of a MOSFET) electrode of the high-potential-side semiconductor switching element 102 and an emitter (source of a MOSFET) electrode thereof, thereby making it possible to detect a collector-to-emitter voltage of the high-potential-side semiconductor switching element 102.

The collector-to-emitter voltage of the high-potential-side semiconductor switching element 102 can detect an unsaturated state of the high-potential-side semiconductor switching element 102. Specifically, when the semiconductor switching elements 102 and 103 operate in the normally ON state, the collector-to-emitter voltage is held in a state where the collector-to-emitter voltage is lowered to a saturated voltage of the semiconductor switching elements 102 and 103. However, when the semiconductor switching elements 102 and 103 are in a short-circuited state, the collector-to-emitter voltage rises from the saturated voltage due to an overcurrent and becomes an unsaturated state. Accordingly, the terminals VU and VL of the drive module 800 are respectively connected to the collector electrode and the emitter electrode of the high-potential-side semiconductor switching element 102, and it is determined whether the collector-to-emitter voltage is a saturated voltage or not, which makes it possible to detect the unsaturated voltage of the high-potential-side semiconductor switching element 102.

First Embodiment

Figure 1:
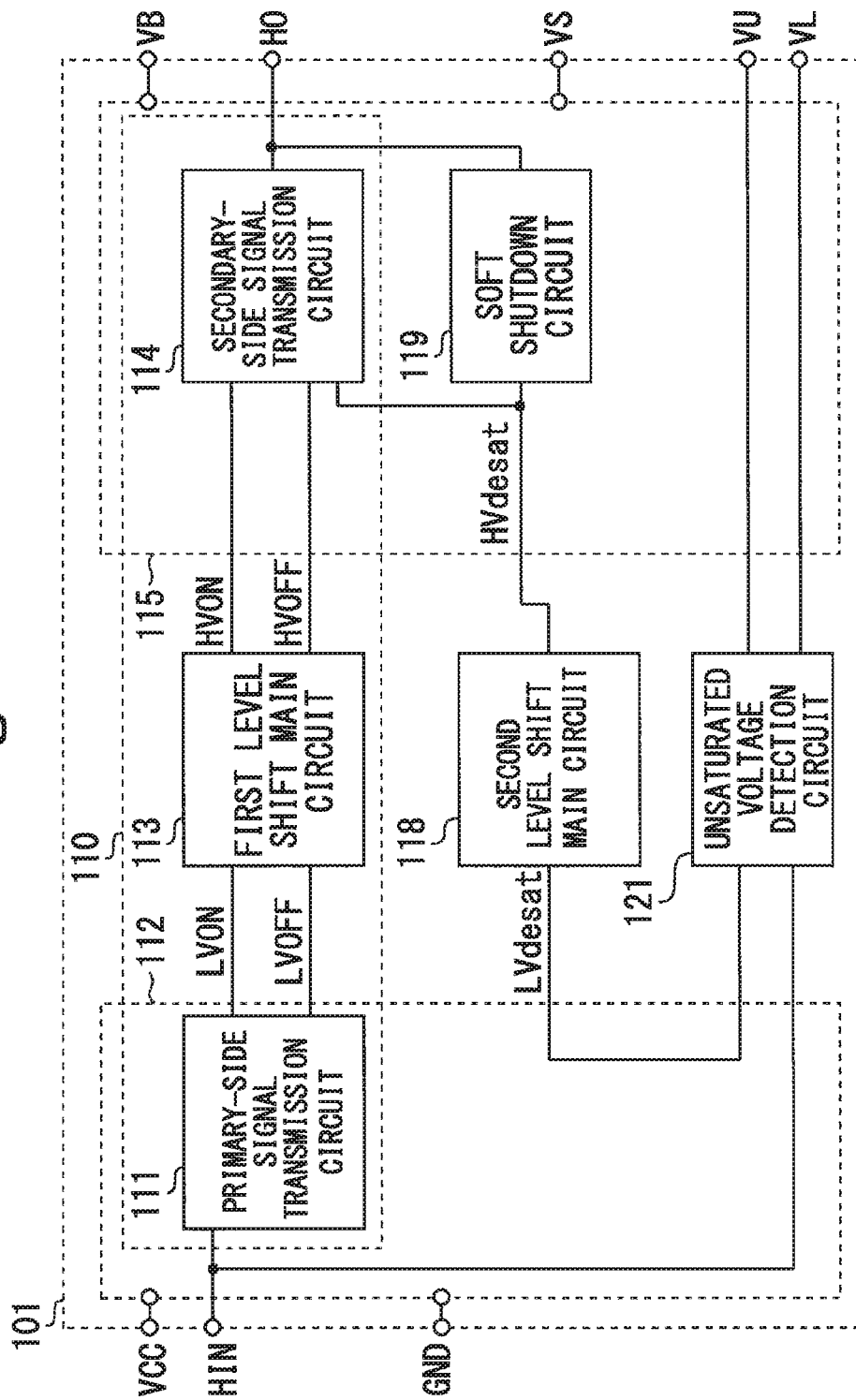
FIG. 1 is a circuit block diagram illustrating the semiconductor device driving integrated circuit according to a first embodiment of the present invention.

FIG. 1 is a circuit block diagram illustrating the semiconductor device driving integrated circuit 101 according to a first embodiment of the present invention. The semiconductor device driving integrated circuit 101 is hereinafter also referred to simply as the "integrated circuit 101". The integrated circuit 101 includes a main signal transmission circuit 110, an unsaturated voltage detection circuit 121, a second level shift main circuit 118, and a soft shutdown circuit 119. The integrated circuit 101 includes a primary-side circuit 112 that operates at a low voltage level, and a secondary-side circuit 115 that operates at a high voltage level. The primary-side circuit 112 includes a primary-side signal transmission circuit 111 included in the main signal transmission circuit 110. The secondary-side circuit 115 includes a secondary-side signal transmission circuit 114 included in the main signal transmission circuit 110, and a soft shutdown circuit 119.

The main signal transmission circuit 110 level-shifts an input signal HIN having a low voltage level to thereby output a drive signal HO having a high voltage level. Specifically, the main signal transmission circuit 110 includes the primary-side signal transmission circuit 111, a first level shift main circuit 113, and the secondary-side signal transmission circuit 114. The primary-side signal transmission circuit 111 is provided at a pre-stage of the first level shift main circuit 113, i.e., at an input side, and the secondary-side signal transmission circuit 114 is provided at a subsequent stage of the first level shift main circuit 113, i.e., at an output side.

The primary-side signal transmission circuit 111 generates a signal LYON and a signal LVOFF. Specifically, the primary-side signal transmission circuit 111 generates the signal LYON and the signal LVOFF in response to the input signal HIN by setting a reference potential as a first reference potential GND and setting a power supply voltage as a first power supply voltage VCC. The signal LYON is a signal that rises in synchronization with a rising edge of the input signal HIN. The signal LVOFF is a signal that rises in synchronization with a falling edge of the input signal HIN. The signal LYON and the signal LVOFF are each transmitted to the first level shift main circuit 113.

The first level shift main circuit 113 level-shifts each of the signal LYON and the signal LVOFF, thereby generating a signal HVON and a signal HVOFF. Specifically, the first level shift main circuit 113 generates the signal HVON and the signal HVOFF based on a second reference potential VS, which is different from the first reference potential GND, in synchronization with the primary-side signals LYON and LVOFF. The signal HVON and the signal HVOFF are each transmitted to the secondary-side signal transmission circuit 114.

The secondary-side signal transmission circuit 114 generates the drive signal HO from the signal HVON and the signal HVOFF. Specifically, the secondary-side signal transmission circuit 114 is a circuit that generates the drive signal HO in response to the signal HVON and the signal HVOFF by setting the reference potential as the second reference potential VS and setting the power supply voltage as a second power supply voltage VB. In the first embodiment, the drive signal HO rises in synchronization with a rising edge of the signal HVON, and falls in synchronization with a rising edge of the signal HVOFF.

The unsaturated voltage detection circuit 121 detects an unsaturated voltage when the high-potential-side semiconductor switching element 102 is in a short-circuited state, and generates a low-potential error signal LVdesat. The low-potential error signal LVdesat is a signal having a low voltage level based on the first reference potential GND as the reference potential. Specifically, the unsaturated voltage detection circuit 121 is connected to the collector of the high-potential-side semiconductor switching element 102 through the terminal VU, and is connected to the emitter of the high-potential-side semiconductor switching element 102 through the terminal VL. The unsaturated voltage detection circuit 121 detects a collector-to-emitter voltage of the high-potential-side semiconductor switching element 102 by the terminals VU and VL respectively connected to the collector and the emitter of the high-potential-side semiconductor switching element 102. The unsaturated voltage detection circuit 121 sets the low-potential error signal LVdesat to low when the collector-to-emitter voltage corresponds to the saturated voltage. The unsaturated voltage detection circuit 121 causes the low-potential error signal LVdesat to rise to high when the collector-to-emitter voltage is equal to or higher than the saturated voltage. The unsaturated voltage detection circuit 121 holds the low-potential error signal LVdesat at the high level for a predetermined period, which is determined in advance, after the low-potential error signal LVdesat rises. Note that as a modified example, the unsaturated voltage detection circuit 121 may hold the high level until a predetermined signal, which is determined in advance, is input after the low-potential error signal LVdesat rises. The preliminarily determined predetermined signal may be generated in the integrated circuit 101, or may be input from the outside of the integrated circuit 101.

To transmit error signal information from the low potential side to the high potential side, the integrated circuit 101 according to the first embodiment includes the second level shift main circuit 118. The second level shift main circuit 118 is provided outside the first level shift main circuit 113 included in the main signal transmission circuit 110, and level-shifts the low-potential error signal LVdesat to a high-potential error signal HVdesat. The integrated circuit 101 inputs the high-potential error signal HVdesat obtained by level-shifting the low-potential error signal LVdesat to the soft shutdown circuit 119. The second level shift main circuit 118 is a circuit similar to the first level shift main circuit 113, and generates the high-potential error signal HVdesat based on the second reference potential VS in synchronization with the low-potential error signal LVdesat. A signal for performing soft shutdown of the high-potential-side semiconductor switching element 102 is transmitted through a path different from a path for transmitting the input signal HIN, thereby simplifying the operation of the signal transmission path.

The secondary-side signal transmission circuit 114 receives the high-potential error signal HVdesat signal from the second level shift main circuit 118. When the high-potential error signal HVdesat signal is high, the secondary-side signal transmission circuit 114 operates in a manner different from the normal operation. Specifically, when the high-potential error signal HVdesat is high, the secondary-side signal transmission circuit 114 neglects the signal HVON and the signal HVOFF and sets the output to a high impedance. In addition, when the high-potential error signal HVdesat is high, the secondary-side signal transmission circuit 114 causes the drive signal HO to rapidly fall after a lapse of a predetermined delay time td1 (see FIG. 2) after the high-potential error signal HVdesat rises. Soft shutdown is performed by the soft shutdown circuit 119 until the predetermined delay time td1 has elapsed.

The soft shutdown circuit 119 is driven at a high voltage level, and supplies a signal for performing soft shutdown of the high-potential-side semiconductor switching element 102 to the high-potential-side semiconductor switching element 102. When the high-potential error signal HVdesat is input, the soft shutdown circuit 119 causes the drive signal HO to slowly fall so as to perform soft shutdown of the high-potential-side semiconductor switching element 102. Specifically, the soft shutdown circuit 119 is a circuit that receives the high-potential error signal HVdesat and causes the voltage value of the drive signal HO to slowly decrease when HVdesat is high. When the unsaturated voltage of the high-potential-side semiconductor switching element 102 is detected, i.e., when the low-potential error signal LVdesat is high, the drive signal HO is caused to perform soft shutdown to thereby relax di/dt during shutdown. Rapid shutdown from a short-circuited state causes a problem that an excessive surge is generated due to steep di/dt. To avoid such a problem, it is preferable to perform soft shutdown to slowly decrease the gate voltage of the high-potential-side semiconductor switching element 102. In this regard, when the high-potential error signal HVdesat is input, the soft shutdown circuit 119 causes the drive signal HO to fall more slowly than a falling edge of the drive HO output from the main signal transmission circuit 110. The execution of soft shutdown makes it possible to suppress di/dt during short-circuit protection and suppress an excessive surge.

As described above, according to the first embodiment, the unsaturated voltage of the high-potential-side semiconductor switching element 102 can be detected at the low potential side. The unsaturated voltage detection circuit 121 outputs the low-potential error signal LVdesat when the unsaturated voltage is detected. In the second level shift main circuit 118, the low-potential error signal LVdesat is transmitted from the primary side (low potential side) to the secondary side (high potential side), and the high-potential error signal HVdesat transmitted to the high potential side is input to the soft shutdown circuit 119. When the high-potential error signal HVdesat is input, the soft shutdown circuit 119 performs soft shutdown of the high-potential-side semiconductor switching element 102. Thus, at the low potential side, the detection of the unsaturated voltage and the generation of the low-potential error signal LVdesat are carried out, and the low-potential error signal LVdesat can be appropriately transmitted to the high potential side and short-circuit protection can be performed by soft shutdown.

Note that specific circuit configurations of the first level shift main circuit 113, the second level shift main circuit 118, and the unsaturated voltage detection circuit 121 are publicly-known techniques. Accordingly, descriptions of the detailed circuit structure and the like of the circuits are omitted.

Figure 2:
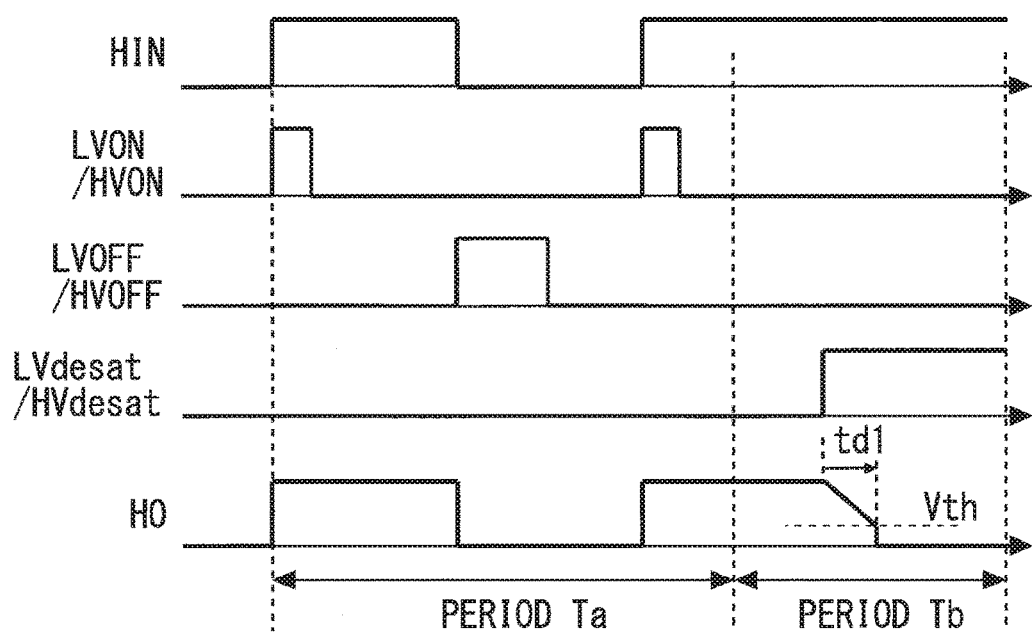
FIG. 2 is a time chart illustrating an operation of the semiconductor device driving integrated circuit according to the first embodiment of the present invention.

FIG. 2 is a time chart illustrating an operation of the semiconductor device driving integrated circuit 101 according to the first embodiment of the present invention. FIG. 2 illustrates a case where the signal LYON, the signal LVOFF, the signal HVON, and the signal HVOFF are pulse signals. In the time chart of FIG. 2, for simplification of illustration, the signals (LYON, LVOFF, LVdesat) that are not level-shifted are respectively superimposed on the level-shifted signals (HVON, HVOFF, HVdesat).

A period Ta in FIG. 2 illustrates a circuit operation during normal operation. The signal LYON rises in synchronization with a rising edge of the input signal HIN, and the signal LVOFF rises in synchronization with a falling edge of the input signal HIN. The drive signal HO rises in synchronization with a rising edge of the signal HVON, and falls in synchronization with a rising edge of the signal HVOFF.

A period Tb in FIG. 2 illustrates a circuit operation in the case where the unsaturated voltage is detected when the input signal HIN is high. When the unsaturated voltage is detected, the low-potential error signal LVdesat rises. The low-potential error signal LVdesat is transmitted to the high potential side by the second level shift main circuit 118, and is input to each of the soft shutdown circuit 119 and the secondary-side signal transmission circuit 114 as the high-potential error signal HVdesat. When the high-potential error signal HVdesat rises, the soft shutdown circuit 119 causes the drive signal HO to slowly fall to thereby perform soft shutdown. Further, the secondary-side signal transmission circuit 114 causes the drive signal HO to rapidly fall after a lapse of the predetermined delay time td1 after the high-potential error signal HVdesat rises.

Note that as a modified example, a predetermined voltage Vth, which is determined in advance, may be used instead of using the delay time td1. Specifically, when the high-potential error signal HVdesat is high, the drive signal HO may be caused to rapidly fall when the drive signal HO is equal to or lower than the predetermined voltage Vth, which is determined in advance, after the high-potential error signal HVdesat rises. This modification can also be applied to second and third embodiments described below.

Figure 3:
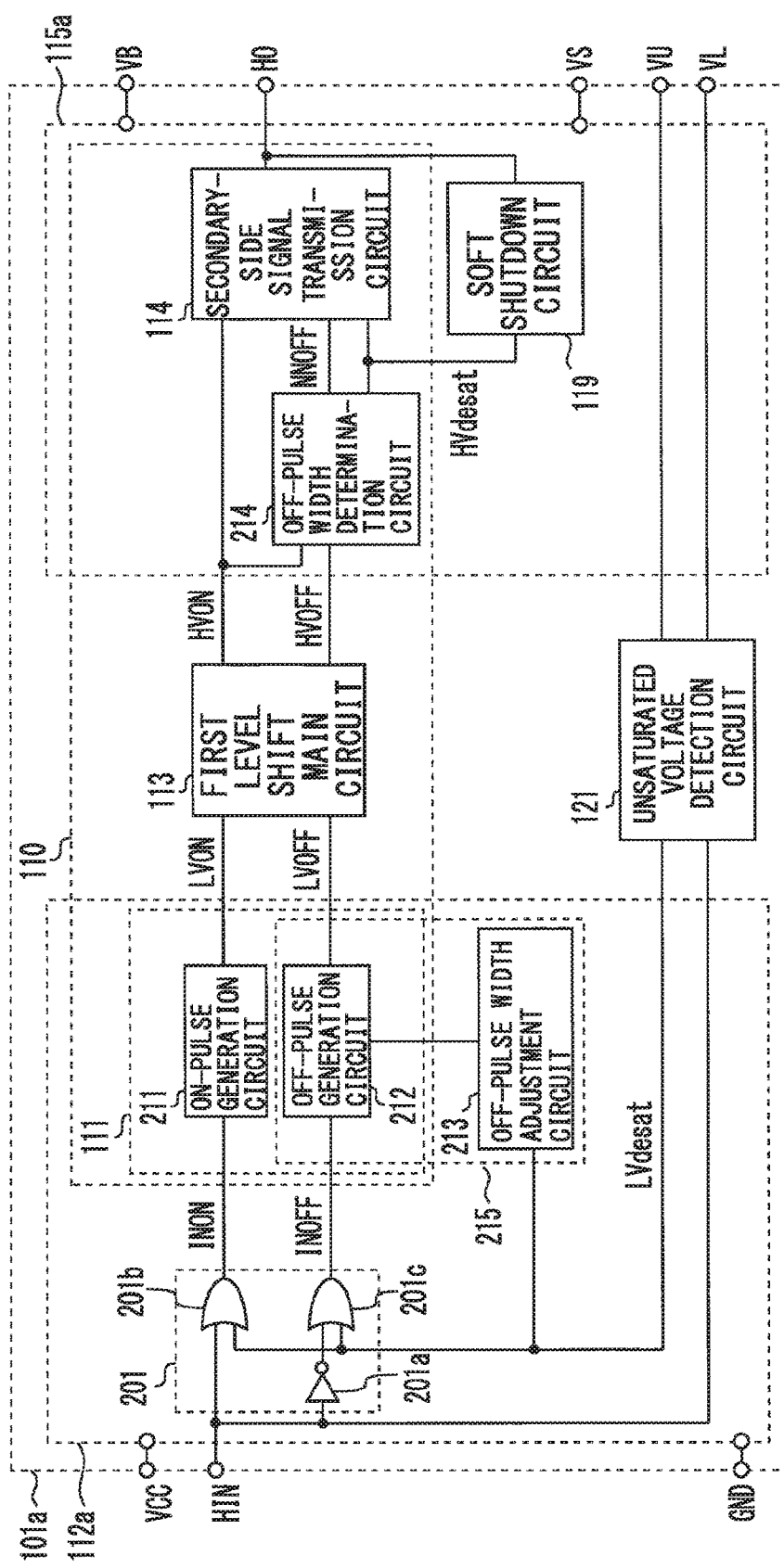
FIG. 3 is a circuit block diagram illustrating the semiconductor device driving integrated circuit according to the second embodiment of the present invention.
Figure 12:
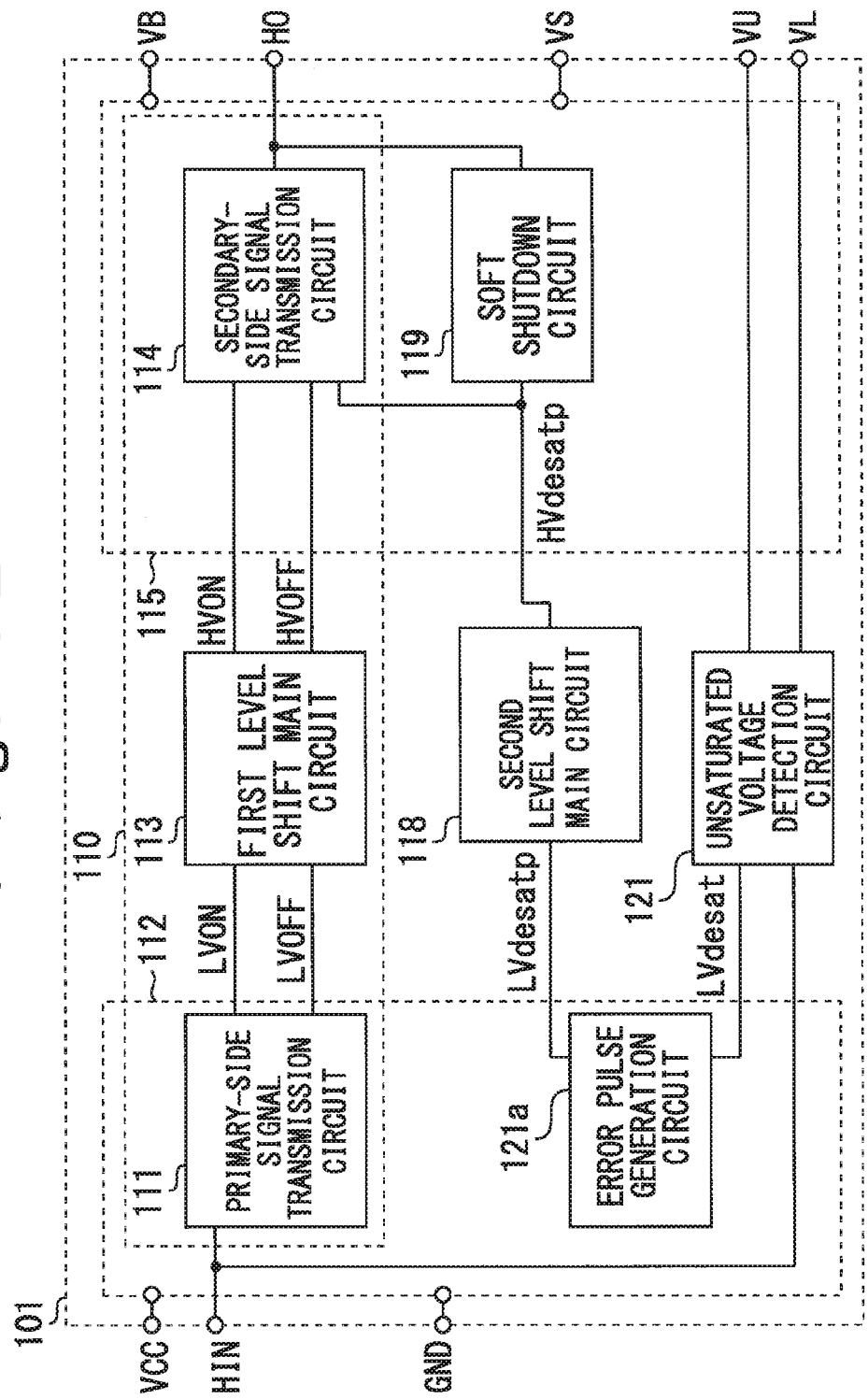
FIG. 12 is a circuit block diagram illustrating a modified example of the semiconductor device driving integrated circuit according to the first embodiment of the present invention.

Note that as illustrated in FIG. 12, the circuit according to the first embodiment may be modified. FIG. 12 is a circuit block diagram illustrating a modified example of the semiconductor device driving integrated circuit according to the first embodiment of the present invention. In the modified example illustrated in FIG. 12, an error pulse generation circuit 121a is added. The error pulse generation circuit 121a is provided to convert the low-potential error signal LVdesat to be input to the second level shift main circuit 118 according to the first embodiment into a low-potential error pulse signal LVdesatp which is a narrow pulse signal. Specifically, the error pulse generation circuit 121a receives an output from the unsaturated voltage detection circuit 121, and when the output from the unsaturated voltage detection circuit 121 rises to high, the error pulse generation circuit 121a outputs a pulse signal having a predetermined width in response to a rising edge of the output. The low-potential error pulse signal LVdesatp output from the error pulse generation circuit 121a is input to the second level shift main circuit 118. The second level shift main circuit 118 level-shifts the low-potential error pulse signal LVdesatp to a high-potential error pulse signal HVdesatp. The high-potential error pulse signal HVdesatp is input to each of the secondary-side signal transmission circuit 114 and the soft shutdown circuit 119, like the high-potential error signal HVdesat according to the first embodiment. The secondary-side signal transmission circuit 114 and the soft shutdown circuit 119 are each configured to execute soft shutdown to cause the drive signal HO to slowly fall, like the waveform illustrated in FIG. 3, in response to a rising edge of the input high-potential error pulse signal HVdesatp. Unlike in the mode in which the low-potential error signal LVdesat is continuously held at high as illustrated in FIG. 3, in the transmission of information based on a narrow pulse signal according to the modified example of FIG. 12, a driving period of the second level shift main circuit 118 can be reduced. The reduction in the driving period leads to suppression of consumption current and heat generation.

Second Embodiment

In the first embodiment described above, the first level shift main circuit 113 and the second level shift main circuit 118 are provided for level-shifting the signal LVOFF, which is a normally off signal, and the low-potential error signal LVdesat, separately, so as to distinguish the signals from each other. On the other hand, in a second embodiment described below, the first level shift main circuit 113 for level-shifting the signal LVOFF is used to transmit the low-potential error signal LVdesat to the high potential side. With this configuration, there is no need to provide a plurality of level shift main circuits, which makes it possible to reduce the circuit area. To transmit the low-potential error signal LVdesat to the high potential side while distinguishing the low-potential error signal LVdesat from the normally off signal, the two signals are distinguished by the pulse width of the signal HVOFF in the second embodiment.

FIG. 3 is a circuit block diagram illustrating the semiconductor device driving integrated circuit 101a according to the second embodiment of the present invention. The semiconductor device driving integrated circuit 101a is hereinafter also referred to simply as the "integrated circuit 101a".

First, similarities between the second embodiment and the first embodiment will be described. The main signal transmission circuit 110 level-shifts the input signal HIN to thereby output the drive signal HO. The main signal transmission circuit 110 includes the first level shift main circuit 113, the primary-side signal transmission circuit 111 that is provided at the pre-stage of the first level shift main circuit 113, the secondary-side signal transmission circuit 114 that is provided at the subsequent stage of the first level shift main circuit 113, and an off-pulse width determination circuit 214. The first level shift main circuit 113 level-shifts the signal LYON and the signal LVOFF to generate the signal HVON and the signal HVOFF, respectively. In the second embodiment, the main signal transmission circuit 110 level-shifts the input signal HIN having a low voltage level, like in the first embodiment, and generates the drive signal HO so that the drive signal HO falls after a delay by a delay time tf1 from a falling edge of the input signal HIN (see FIG. 6).

Like in the first embodiment, the unsaturated voltage detection circuit 121 outputs the low-potential error signal LVdesat when the unsaturated voltage of the high-potential-side semiconductor switching element 102 is detected.

The integrated circuit 101a illustrated in FIG. 3 has a configuration in which the primary-side circuit 112 and the secondary-side circuit 115 according to the first embodiment are replaced by a primary-side circuit 112a and a secondary-side circuit 115a, respectively. The primary-side circuit 112a includes an input logic circuit 201, the primary-side signal transmission circuit 111, and an off-pulse width adjustment circuit 213.

The input logic circuit 201 receives the input signal HIN and the low-potential error signal LVdesat. When the low-potential error signal LVdesat is low, the input logic circuit 201 outputs a signal INON that is synchronous with the input signal HIN and a signal INOFF that is synchronous with the inverted signal of the input signal HIN. The input logic circuit 201 sets the signal INON and the signal INOFF to high regardless of the input signal HIN, when the low-potential error signal LVdesat is high. When the input signal HIN is high and the unsaturated voltage is detected, the low-potential error signal LVdesat becomes high, so that the signal INON is maintained at high and the signal INOFF rises in synchronization with the low-potential error signal LVdesat.

The primary-side signal transmission circuit 111 includes an on-pulse generation circuit 211 and an off-pulse generation circuit 212. The on-pulse generation circuit 211 outputs the signal LYON having a low voltage level that rises in response to a rising edge of the input signal HIN. The off-pulse generation circuit 212 outputs the signal LVOFF having a low voltage level that rises in response to a falling edge of the input signal HIN.

When the low-potential error signal LVdesat is low, the on-pulse generation circuit 211 outputs the signal LYON having a third pulse width PW3 in synchronization with a rising edge of the signal INON. When the low-potential error signal LVdesat is low, the off-pulse generation circuit 212 outputs the signal LVOFF having a first pulse width PW1 in synchronization with a rising edge of the signal INOFF. When the low-potential error signal LVdesat is high, the off-pulse generation circuit 212 outputs a pulse signal in synchronization with a rising edge of the signal INOFF output from the input logic circuit 201 described above.

The off-pulse width adjustment circuit 213 is a circuit that adjusts the pulse width of the signal LVOFF generated by the off-pulse generation circuit 212. The off-pulse width adjustment circuit 213 sets the pulse width of the signal LVOFF to the first pulse width PW1 when the low-potential error signal LVdesat is low. On the other hand, the off-pulse width adjustment circuit 213 reduces the pulse width of the signal LVOFF when the low-potential error signal LVdesat is high, thereby generating a "converted signal LVOFF1" having a second pulse width PW2 which has a different width from that of the first pulse width PW1. In the second embodiment, for example, PW1>PW2 is set, and the pulse width is adjusted to be narrower than that during the normal operation when the low-potential error signal LVdesat is high. Thus, when the low-potential error signal LVdesat is input, the off-pulse width adjustment circuit 213 cooperates with the input logic circuit 201 and the off-pulse generation circuit 212, and the "converted signal LVOFF1" having a pulse width different from the normal signal LVOFF can be input to the first level shift main circuit 113.

As illustrated in FIG. 3, the secondary-side circuit 115a includes the off-pulse width determination circuit 214, the secondary-side signal transmission circuit 114, and the soft shutdown circuit 119.

The off-pulse width determination circuit 214 is a circuit that determines the pulse width of the signal HVOFF output from the first level shift main circuit 113. When the off-pulse width determination circuit 214 determines that the pulse width of the signal HVOFF is equal to the first pulse width PW1, the off-pulse width determination circuit 214 sets the high-potential error signal HVdesat to low, and transmits the signal NNOFF to the secondary-side signal transmission circuit 114 without any delay. On the other hand, when the off-pulse width determination circuit 214 determines that the pulse width of the signal HVOFF is equal to the second pulse width PW2, i.e., determines that the converted signal LVOFF1 is output from the first level shift main circuit 113, the off-pulse width determination circuit 214 sets the high-potential error signal HVdesat to high, and delays the signal NNOFF by a predetermined delay time tf2, then transmits the signal NNOFF to the secondary-side signal transmission circuit 114.

Figure 6:
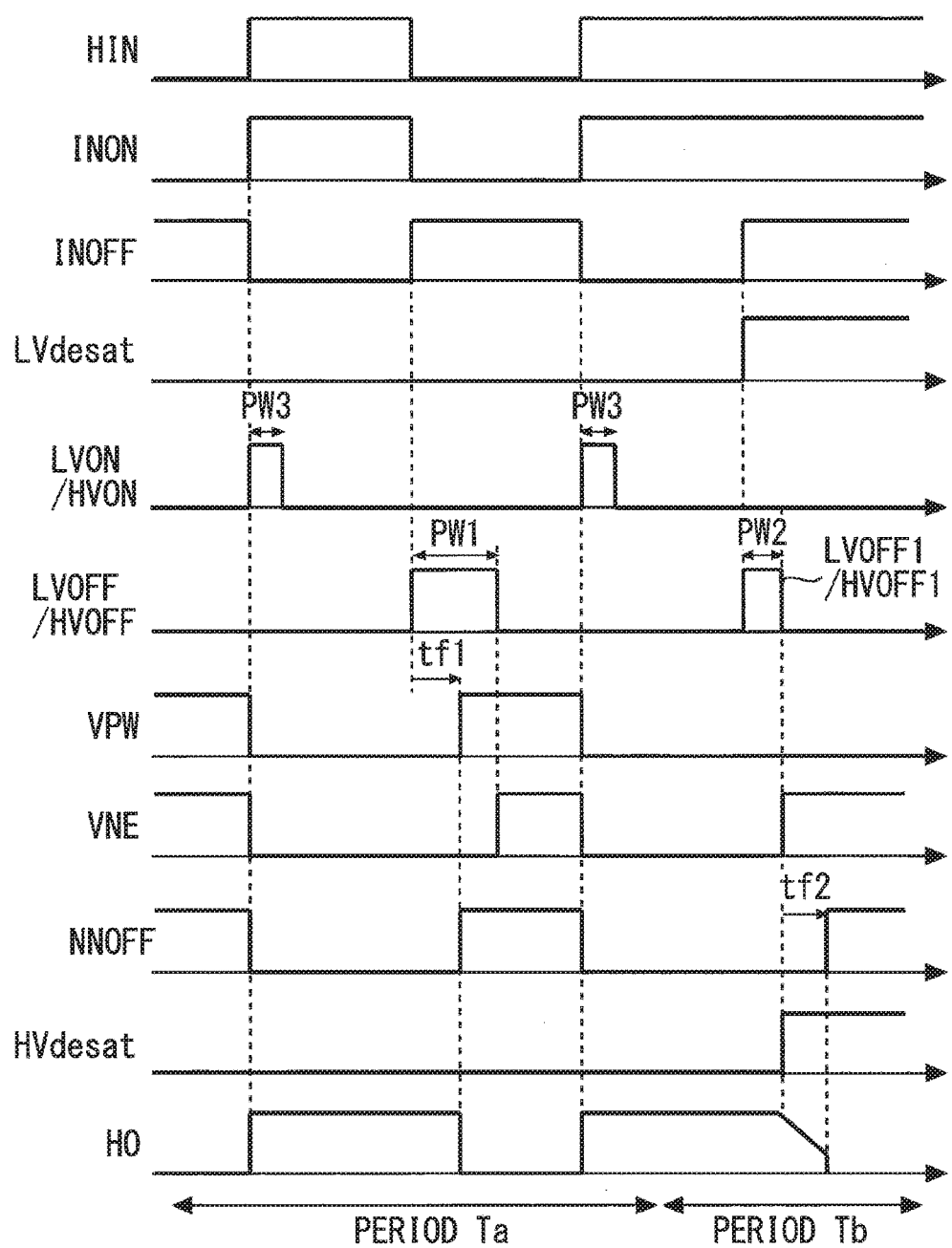
FIG. 6 is a time chart illustrating an operation of the semiconductor device driving integrated circuit according to the second embodiment of the present invention.

Like in the first embodiment, the secondary-side signal transmission circuit 114 generates the drive signal HO that rises in response to an input of the signal HVON and falls in response to an input of the signal HVOFF. In addition, the secondary-side signal transmission circuit 114 receives the high-potential error signal HVdesat, and sets the output to a high impedance when the high-potential error signal HVdesat is high and the signal NNOFF is low. Note that as illustrated in FIG. 6, in the second embodiment, the off-pulse width determination circuit 214 is interposed to thereby allow the secondary-side signal transmission circuit 114 to fall the drive signal HO by the delay time tf1 from a falling edge of the input signal HIN, even during the normal operation in which the unsaturated voltage is not detected. Note that a modification in which the drive signal HO rises after a delay by the delay time tf1 even when the input signal HIN rises is preferably carried out, though the modification is not applied to the second embodiment. With this configuration, the signal width of the input signal HIN can be set to be equal to the signal width of the drive signal HO. This modification can also be used in a third embodiment.

Like in the first embodiment, the soft shutdown circuit 119 is driven at the high voltage level, and when the high-potential error signal HVdesat is input, the drive signal HO is caused to slowly fall so as to perform soft shutdown of the high-potential-side semiconductor switching element 102. Thus, according to the second embodiment, the detection of the unsaturated voltage and the generation of the low-potential error signal LVdesat can be carried out at the low potential side, and the low-potential error signal LVdesat can be appropriately transmitted to the high potential side and short-circuit protection can be performed. After starting soft shutdown, the off-pulse width determination circuit 214 delays the signal NNOFF by the delay time tf2 and then transmits the signal NNOFF to the secondary-side signal transmission circuit 114, thereby performing hard shutdown of the high-potential-side semiconductor switching element 102.

Figure 4:
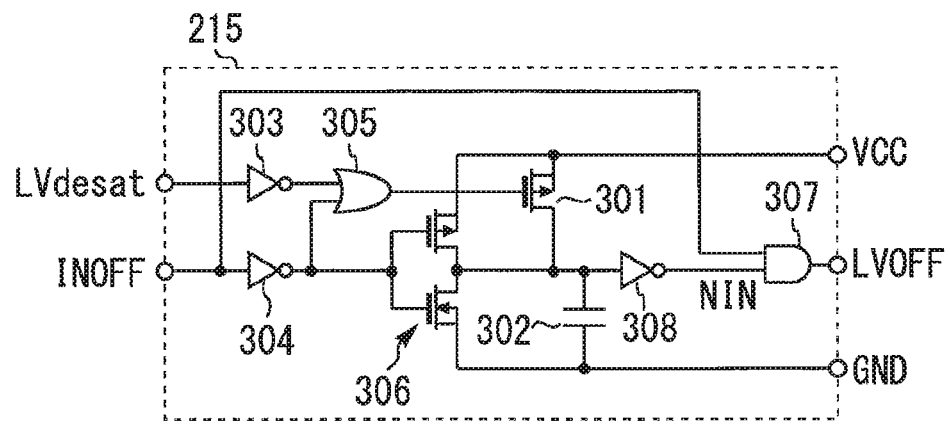
FIG. 4 is a circuit diagram illustrating a part of the semiconductor device driving integrated circuit according to the second embodiment of the present invention.

FIG. 4 is a circuit diagram illustrating a part of the semiconductor device driving integrated circuit 101a according to the second embodiment of the present invention. FIG. 4 illustrates an example of a specific circuit configuration of the off-pulse generation unit 215 according to the second embodiment. The off-pulse generation unit 215 is a circuit in which the off-pulse generation circuit 212 and the off-pulse width adjustment circuit 213 are integrated.

As illustrated in FIG. 4, the off-pulse generation unit 215 includes a NOT circuit 303 that receives the low-potential error signal LVdesat, a NOT circuit 304 that receives the input logic signal INOFF, an OR circuit 305 that receives output signals from the NOT circuits 303 and 304, a PMOS transistor 301 having a gate that receives an output signal from the OR circuit 305, a CMOS inverter circuit 306 that inverts the output signal from the NOT circuit 304, a NOT circuit 308 that receives the output signal from the CMOS inverter circuit 306, and an AND circuit 307 that receives the output signal from the NOT circuit 308 and the input logic signal INOFF. The output signal from the AND circuit 307 corresponds to the signal LVOFF. A power supply VCC is applied to the source of the PMOS transistor 301, and the drain of the PMOS transistor 301 is connected to a node between one end of the capacitative element 302 and the input side of the NOT circuit 308. The other end of the capacitative element 302 is connected to the reference potential GND.

The off-pulse generation unit 215 generates the signal LVOFF, which is normally off signals, and the converted signal LVOFF1, by calculating an AND between the signal INOFF and a delayed inverted signal NIN by the AND circuit 307. The delayed inverted signal NIN is a signal obtained by delaying and inverting the signal INOFF. Specifically, the delayed inverted signal NIN is delayed by charging the capacitative element 302 at a rising edge of the signal INOFF and high and low of the delayed signal INOFF are inverted by the NOT circuit 308. The off-pulse generation unit 215 switches driving of the PMOS transistor 301 by the low-potential error signal LVdesat, and a charge current is adjusted to thereby adjust the pulse width. In a specific example illustrated in FIG. 4, the signal LVOFF, which is a normally off signal, is generated by increasing the pulse width when the low-potential error signal LVdesat is low, and the converted signal LVOFF1 is generated by adjusting the pulse width to be reduced when the low-potential error signal LVdesat is high.

Figure 5:
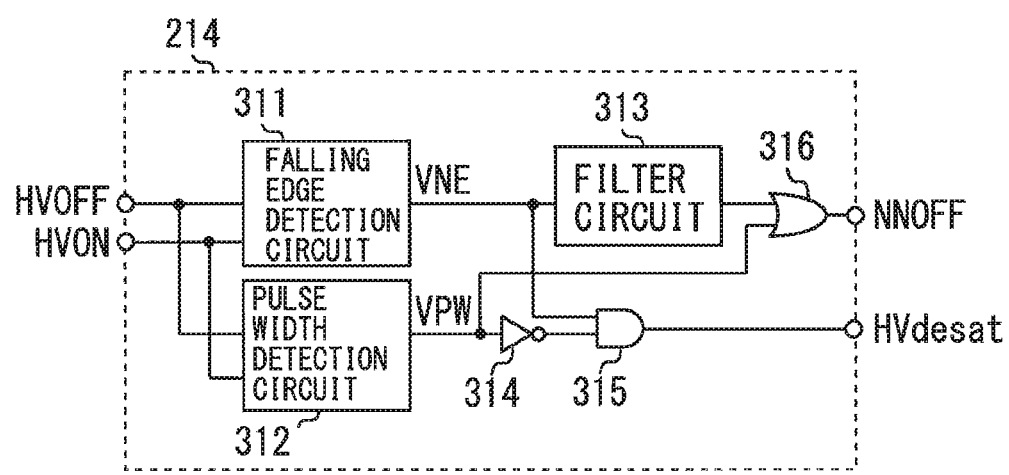
FIG. 5 is a circuit block diagram illustrating a part of the semiconductor device driving integrated circuit according to the second embodiment of the present invention.

FIG. 5 is a circuit block diagram illustrating a part of the semiconductor device driving integrated circuit 101a according to the second embodiment of the present invention. FIG. 5 illustrates an example of a specific circuit configuration of the off-pulse width determination circuit 214.

The off-pulse width determination circuit 214 includes a falling edge detection circuit 311, a pulse width detection circuit 312, a filter circuit 313, a NOT circuit 314, an AND circuit 315, and an OR circuit 316. The falling edge detection circuit 311 is a circuit that generates a signal VNE. The signal VNE rises in synchronization with a falling edge of the signal HVOFF, and falls in synchronization with a rising edge of the signal HVON.

The pulse width detection circuit 312 is a circuit that generates a signal VPW when the pulse width of the signal HVOFF is larger than the second pulse width PW2. Further, when the pulse width of the signal HVOFF is equal to or narrower than the second pulse width PW2, the pulse width detection circuit 312 does not generate the signal VPW. The signal VPW rises after the signal is delayed by the predetermined delay time tf1 from a rising edge of the signal HVOFF, and falls in synchronization with a rising edge of the signal HVON.

The signal NNOFF and the high-potential error signal HVdesat are generated based on the AND or OR between the signal VNE and the signal VPW. Specifically, the signal VNE and the inverted signal of the signal VPW by the NOT circuit 314 are each input to the AND circuit 315. The AND circuit 315 calculates the AND between the inverted signal of the signal VPW and the signal VNE, to thereby generate the high-potential error signal HVdesat. On the other hand, the signal VNE that has passed through the filter circuit 313 and the signal VPW are input to the OR circuit 316. The OR circuit 316 calculates the OR between the signal VNE and the signal VPW, to thereby generate the signal NNOFF.

As described above, the integrated circuit 101a according to the second embodiment converts information about the low-potential error signal LVdesat into the high-potential error signal HVdesat having a high voltage level, and inputs the converted signal to the soft shutdown circuit 119. To transmit the error signal information, in the second embodiment, the "converted signal LVOFF1" obtained by converting the low-potential error signal LVdesat into a pulse signal is input to the first level shift main circuit 113. Further, the off-pulse width determination circuit 214 detects the "converted signal HVOFF1", which is obtained by level-shifting the converted signal LVOFF1 based on the difference between pulse widths, from the output of the first level shift main circuit 113. The off-pulse width determination circuit 214 generates the high-potential error signal HVdesat in response to the "converted signal HVOFF1". Through the series of operations, the high-potential error signal HVdesat can be generated based on the converted signal HVOFF1 obtained by level-shifting the converted signal LVOFF1 by the first level shift main circuit 113. As a result, the low-potential error signal LVdesat can be converted into the high-potential error signal HVdesat. The low-potential error signal LVdesat can be transmitted to the high potential side through the same path as that for the input signal HIN, thereby making it possible to reduce the circuit area as compared with the first embodiment, which leads to space saving. Moreover, in the second embodiment, pulse signals can be easily discriminated based on the difference between pulse widths.

FIG. 6 is a time chart illustrating an operation of the semiconductor device driving integrated circuit 101a according to the second embodiment of the present invention. The period Ta illustrates a sequence during the normal operation. The period Tb illustrates a sequence in the case where the unsaturated voltage is detected when the input signal HIN is high.

In the period Ta, the signal LYON rises as the pulse signal having the third pulse width PW3 in synchronization with a rising edge of the input signal HIN, and the drive signal HO rises in synchronization with a rising edge of the signal LYON. At a falling edge of the input signal HIN, the signal LVOFF rises as the pulse signal having the first pulse width PW1 in synchronization with a falling edge of the input signal HIN; VPW rises after a lapse of the predetermined delay time tf1, which is determined in advance, from a rising edge of the signal HVOFF transmitted from the high potential side; and the signal VNE rises in synchronization with a falling edge of the signal HVOFF.

Since the signal VPW rises prior to the signal VNE, the signal NNOFF rises in synchronization with a rising edge of the signal VPW according to the OR obtained by the OR circuit 316, and the high-potential error signal HVdesat is not generated according to the AND obtained by the AND circuit 315. When the signal NNOFF is input to the secondary-side signal transmission circuit 114, the drive signal HO rapidly falls, so that high-potential-side semiconductor switching element 102 is hardly shut down.

In the period Tb, the low-potential error signal LVdesat rises when the unsaturated voltage is detected. The signal INOFF rises in synchronization with a rising edge of the low-potential error signal LVdesat, and the converted signal LVOFF1 having the second pulse width PW2 rises in synchronization with a rising edge of the signal INOFF. By the converted signal LVOFF1 being level-shifted by the first level shift main circuit 113, the converted signal HVOFF1 is transmitted to the high potential side. Since the pulse width of the converted signal HVOFF1 is the second pulse width PW2, the pulse width detection circuit 312 does not generate the signal VPW and the falling edge detection circuit 312 causes the signal VNE to rise in synchronization with a falling edge of the signal HVOFF.

According to the AND obtained by the AND circuit 315, the high-potential error signal HVdesat rises in synchronization with a rising edge of the signal VNE. By passing through the filter circuit 313, the signal NNOFF rises after a lapse of a delay time tr2 from a rising edge of the signal VNE. In response to a rising edge of the high-potential error signal HVdesat, the output of the secondary-side signal transmission circuit 114 is set to a high impedance, and the soft shutdown circuit 119 causes the drive signal HO to slowly fall. Thus, soft shutdown can be achieved when the high-potential-side semiconductor switching element 102 is short-circuited. After soft shutdown is started, the drive signal HO rapidly falls in synchronization with a rising edge of the signal NNOFF after a lapse of the delay time tf2, and the high-potential-side semiconductor switching element 102 is rapidly shut down.

Note that in the second embodiment, as a specific example, the pulse width is adjusted to be increased when the low-potential error signal LVdesat is low, and the pulse width is adjusted to be reduced when the low-potential error signal LVdesat is high. On the other hand, as a modified example, the off-pulse width adjustment circuit 213 and the off-pulse width determination circuit 214 may be modified so that the pulse width is adjusted to be reduced when the low-potential error signal LVdesat is low and the pulse width is adjusted to be increased when the low-potential error signal LVdesat is high.

Third Embodiment

In the second embodiment described above, the signal LVOFF, which is a normally off signal, and the low-potential error signal LVdesat are distinguished from each other by the pulse width of the pulse signal HVOFF. On the other hand, in a third embodiment, the signal LVOFF, which is a normally off signal, and the low-potential error signal LVdesat, are distinguished from each other based on the difference in "the number of pulses per output" of the pulse signal HVOFF. "The number of pulses per output" refers to the number of pulses continuously output per rising edge or falling edge. For example, in the case of a pulse signal that rises in response to a rising edge of another signal, when two pulses are output per rising edge of the pulse signal, "the number of pulses per output" is two. For convenience of explanation, "the number of pulses per output" may be hereinafter referred to simply as "the number of pulses".

Figure 7:
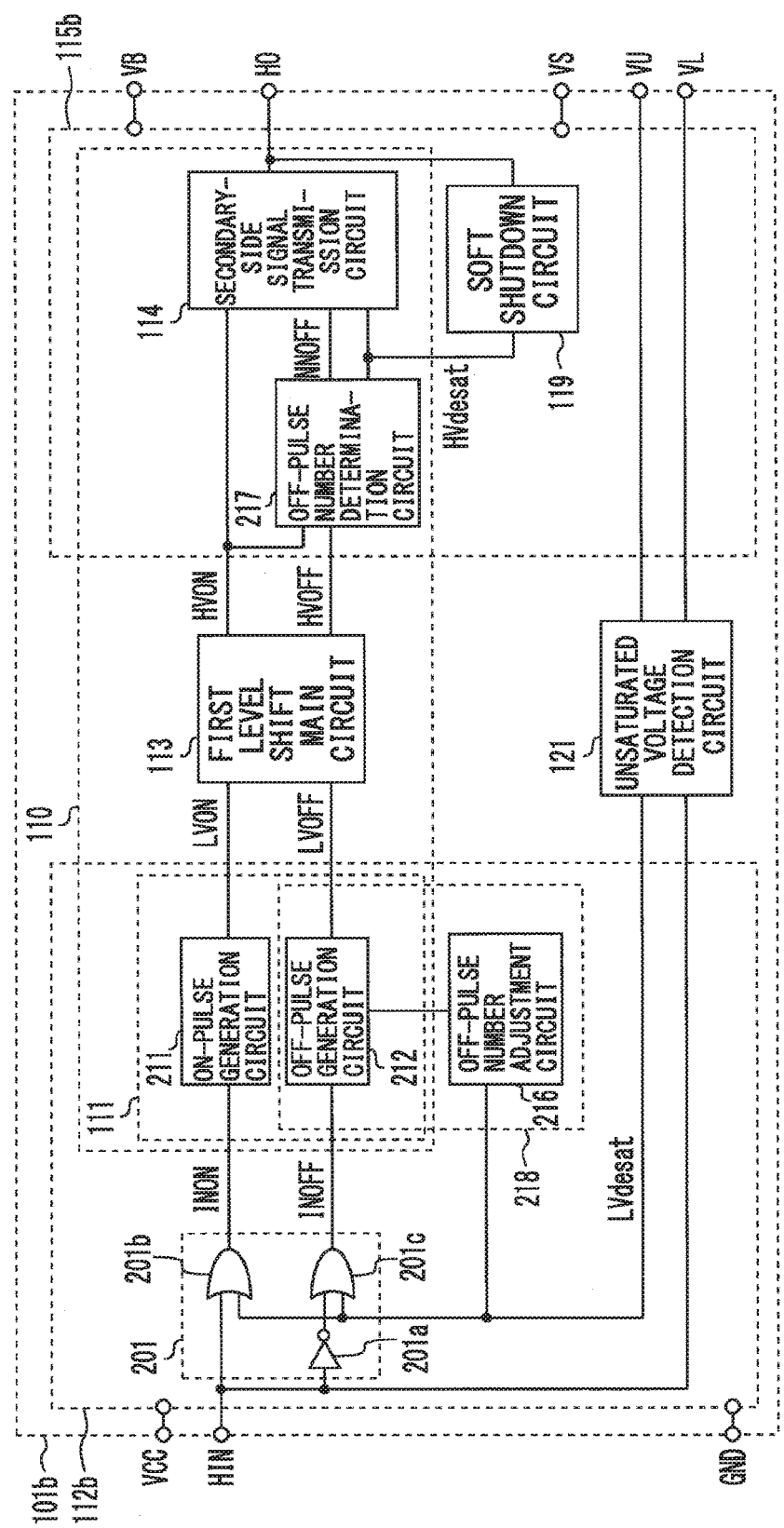
FIG. 7 is a circuit block diagram illustrating the semiconductor device driving integrated circuit according to a third embodiment of the present invention.

FIG. 7 is a circuit block diagram illustrating the semiconductor device driving integrated circuit 101b according to the third embodiment of the present invention. The semiconductor device driving integrated circuit 101b is hereinafter also referred to simply as the "integrated circuit 101b".

First, similarities between the third embodiment and the first and second embodiments will be described. The third embodiment is similar to the first and second embodiments in that the main signal transmission circuit 110 includes the first level shift main circuit 113, the primary-side signal transmission circuit 111, and the secondary-side signal transmission circuit 114. However, the third embodiment is different from the first and second embodiments in that an off-pulse number determination circuit 217 is provided.

The main signal transmission circuit 110 level-shifts the input signal HIN having a low voltage level, like in the first embodiment, and generates the drive signal HO so that the drive signal HO falls after a delay by a delay time tf4 (see FIG. 10) from a falling edge of the input signal HIN. While a specific mechanism for generating a delay from the falling edge will be described below with reference to FIG. 10, the signal NNOFF rises in synchronization with a rising edge of the last pulse of the signal HVOFF, and the drive signal HO falls in synchronization with a rising edge of the signal NNOFF.

Like in the first and second embodiments, the unsaturated voltage detection circuit 121 outputs the low-potential error signal LVdesat when the unsaturated voltage of the high-potential-side semiconductor switching element 102 is detected.

The integrated circuit 101b illustrated in FIG. 7 has a configuration in which the primary-side circuit 112a and the secondary-side circuit 115a of the second embodiment are replaced by a primary-side circuit 112b and a secondary-side circuit 115b, respectively. The primary-side circuit 112b includes an off-pulse number adjustment circuit 216 in place of the off-pulse width adjustment circuit 213 according to the second embodiment. The secondary-side circuit 115b includes an off-pulse number determination circuit 217 in place of the off-pulse width determination circuit 214 according to the second embodiment.

As illustrated in FIG. 7, the primary-side circuit 112b includes the input logic circuit 201, the primary-side signal transmission circuit 111, and the off-pulse number adjustment circuit 216.

The primary-side signal transmission circuit 111 includes an on-pulse generation circuit 211 and an off-pulse generation circuit 212. When the low-potential error signal LVdesat is low, the on-pulse generation circuit 211 outputs the signal LYON having a third pulse number PN3 in synchronization with a rising edge of the signal INON, and the off-pulse generation circuit 212 outputs the signal LVOFF having a first pulse number PN1 in synchronization with a rising edge of the signal INOFF. In the third embodiment, the first pulse number PN1 is "two" and the third pulse number PN3 is "one".

On the other hand, the off-pulse generation circuit 212 cooperates with the off-pulse number adjustment circuit 216 when the low-potential error signal LVdesat is high, and outputs a "converted signal LVOFF2" having a second pulse number PN2, which is different from the first pulse number PN1, in synchronization with a rising edge of the signal INOFF. In the third embodiment, the second pulse number PN2 is "one".

The off-pulse number adjustment circuit 216 is a circuit that adjusts the number of pulses of the signal LVOFF generated by the off-pulse generation circuit 212. The off-pulse number adjustment circuit 216 sets the number of pulses of the signal LVOFF to the first pulse number PN1, i.e., to two, when the low-potential error signal LVdesat is low. On the other hand, the off-pulse number adjustment circuit 216 reduces the number of pulses of the signal LVOFF to the second pulse number PN2, which is different from the first pulse number PN1, when the low-potential error signal LVdesat is high. In the third embodiment, as a specific example, the first pulse number PN1 is "two" and the second pulse number PN2 is "one", and thus PN1 is larger than PN2. Thus, when the low-potential error signal LVdesat is input, the off-pulse number adjustment circuit 216 cooperates with the input logic circuit 201 and the off-pulse generation circuit 212, and thus can input the "converted signal LVOFF2" having the number of pulses per output that is different from the number of pulses of the normal signal LVOFF to the first level shift main circuit 113. The converted signal LVOFF2 is level-shifted to the "converted signal HVOFF2" by the first level shift main circuit 113.

As illustrated in FIG. 7, the secondary-side circuit 115b includes an off-pulse number determination circuit 217, the secondary-side signal transmission circuit 114, and the soft shutdown circuit 119.

The off-pulse number determination circuit 217 is a circuit that determines the number of pulses of the signal HVOFF output from the first level shift main circuit 113. When the off-pulse number determination circuit 217 determines that the number of pulses of the signal HVOFF is the first pulse number PN1, the off-pulse number determination circuit 217 sets the high-potential error signal HVdesat to low and outputs the signal NNOFF without any delay. On the other hand, when the off-pulse number determination circuit 217 determines that the number of pulses of the signal HVOFF is the second pulse number PN2, i.e., determines that the converted signal HVOFF2 is output from the first level shift main circuit 113, the off-pulse number determination circuit 217 sets the high-potential error signal HVdesat to high, and outputs the signal NNOFF after a lapse of the predetermined delay time tf2.

The high-potential error signal HVdesat is supplied to the soft shutdown circuit 119, and serves as a soft shutdown start signal. Like in the first and second embodiments, when the high-potential error signal HVdesat is input, the soft shutdown circuit 119 causes the drive signal HO to slowly fall so that the high-potential-side semiconductor switching element 102 is softly shut down. Thus, according to the third embodiment, the detection of the unsaturated voltage and the generation of the low-potential error signal LVdesat can be carried out at the low potential side and short-circuit protection can be performed by appropriately transmitting the low-potential error signal LVdesat to the high potential side. In addition, after soft shutdown is started, the signal NNOFF is transmitted to the secondary-side signal transmission circuit 114 after the off-pulse number determination circuit 217 delays the signal by the delay time tf2. When the signal NNOFF is supplied to the secondary-side signal transmission circuit 114, the secondary-side signal transmission circuit 114 causes the drive signal HO to rapidly fall. With this configuration, the high-potential-side semiconductor switching element 102 is rapidly shut down.

FIGS. 8 and 9 are circuit block diagrams illustrating a part of the semiconductor device driving integrated circuit 101b according to the third embodiment of the present invention. FIGS. 8 and 9 illustrate specific circuit configurations of the off-pulse generation unit 218 and the off-pulse number determination circuit 217 when the first pulse number PN1 is two and the second pulse number PN2 is one.

FIG. 8 illustrates an example of a specific circuit configuration of the off-pulse generation unit 218 according to this embodiment. The off-pulse generation unit 218 includes a first one-shot pulse generation circuit 401, a second one-shot pulse generation circuit 402, a NOT circuit 403, an AND circuit 404, and a delay circuit 405. The input logic signal INOFF is input to the first one-shot pulse generation circuit 401. An output signal from the first one-shot pulse generation circuit 401 is input to an OR circuit 406. The AND circuit 404 receives the input logic signal INOFF and the inverted signal obtained by inverting the low-potential error signal LVdesat by the NOT circuit 403. An output signal from the AND circuit 404 is input to the delay circuit 405 and an output signal from the delay circuit 405 is input to the second one-shot pulse generation circuit 402. An output signal from the second one-shot pulse generation circuit 402 is input to the OR circuit 406. An output signal from the OR circuit 406 corresponds to the signal LVOFF. The off-pulse generation unit 218 switches driving of the second one-shot pulse generation circuit 402 by the low-potential error signal LVdesat, thereby adjusting the number of pulses according to the low-potential error signal LVdesat. In the specific example of FIG. 8, the number of pulses when the low-potential error signal LVdesat is low is two, and the number of pulses when the low-potential error signal LVdesat is high is one. That is, in the specific example of FIG. 8, the number of pulses when the low-potential error signal LVdesat is high is set to be smaller than the number of pulses when the low-potential error signal LVdesat is low.

FIG. 9 illustrates an example of a specific circuit configuration of the off-pulse number determination circuit 217. The off-pulse number determination circuit 217 includes a first pulse falling edge detection circuit 411, a second pulse rising edge detection circuit 412, a second pulse falling edge detection circuit 413, a filter circuit 414, an OR circuit 415, a NOT circuit 416, and an AND circuit 417. The first pulse falling edge detection circuit 411 is a circuit that generates a signal VFE. The signal VFE falls in synchronization with a rising edge of the signal HVON, and rises in synchronization with a falling edge of the first pulse of the signal HVOFF. The second pulse rising edge detection circuit 412 is a circuit that generates a signal VSP based on the signal VFE, and the signal HVOFF. The signal VSP rises in synchronization with a rising edge of the second pulse of the signal HVOFF, and falls in synchronization with a falling edge of the signal VFE. The second pulse falling edge detection circuit 413 is a circuit that generates the signal VSE. The signal VSE falls in synchronization with a rising edge of the signal HVON, and rises after a lapse of a delay time tf3 from a falling edge of the last pulse of the signal HVOFF. The signal VSP and the signal VSE which has passed through the filter circuit 414 are input to the OR circuit 415. An output signal from the OR circuit 415 corresponds to the signal NNOFF. An inverted signal obtained by inverting the signal VSP by the NOT circuit 416 and the signal VSE are input to the AND circuit 417. An output signal from the AND circuit 417 corresponds to the high-potential error signal HVdesat.

As described above, the integrated circuit 101b according to the third embodiment converts information about the low-potential error signal LVdesat into the high-potential error signal HVdesat having a high voltage level and inputs the converted signal to the soft shutdown circuit 119. To transmit the error signal information, like in the second embodiment, also in the third embodiment, the integrated circuit 101b inputs the "converted signal LVOFF2" obtained by converting the low-potential error signal LVdesat into a pulse signal to the first level shift main circuit 113. The "converted signal LVOFF2" according to the third embodiment is different from that of the second embodiment in that not the pulse width, but instead the number of pulses per output of the converted signal LVOFF2 is set to be different from that of the signal LVOFF. Further when the "converted signal HVOFF2" is detected from the output of the first level shift main circuit 113 in the off-pulse number determination circuit 217, the high-potential error signal HVdesat is output. Through the series of operations, the high-potential error signal HVdesat can be generated based on the converted signal HVOFF2 obtained by level-shifting the converted signal LVOFF2 by the first level shift main circuit 113. As a result, the low-potential error signal LVdesat can be converted into the high-potential error signal HVdesat. The low-potential error signal LVdesat can be transmitted to the high potential side through the same path as that for the input signal HIN, thereby making it possible to reduce the circuit area as compared with the first embodiment, which leads to space saving.

Also in the third embodiment, specifically, by the function for adjusting the number of pulses by the off-pulse number adjustment circuit 216, the normally off signal HVOFF and the converted signal HVOFF2 can be distinguished from each other at the high potential side (second side) by the difference in the number of pulses of the pulse signal HVOFF. When the number of pulses representing a normally off signal when the unsaturated voltage is not detected is set as the first pulse number PN1 and the number of pulses representing an error off signal when the unsaturated voltage is detected is set as the second pulse number PN2, the low-potential error signal LVdesat can be transmitted to the high potential side using the difference in the number of pulses. In the transmission of information based on the difference in the number of pulses, the driving period of level shift main circuit 113 can be reduced, which leads to suppression of consumption current and heat generation.

Figure 10:
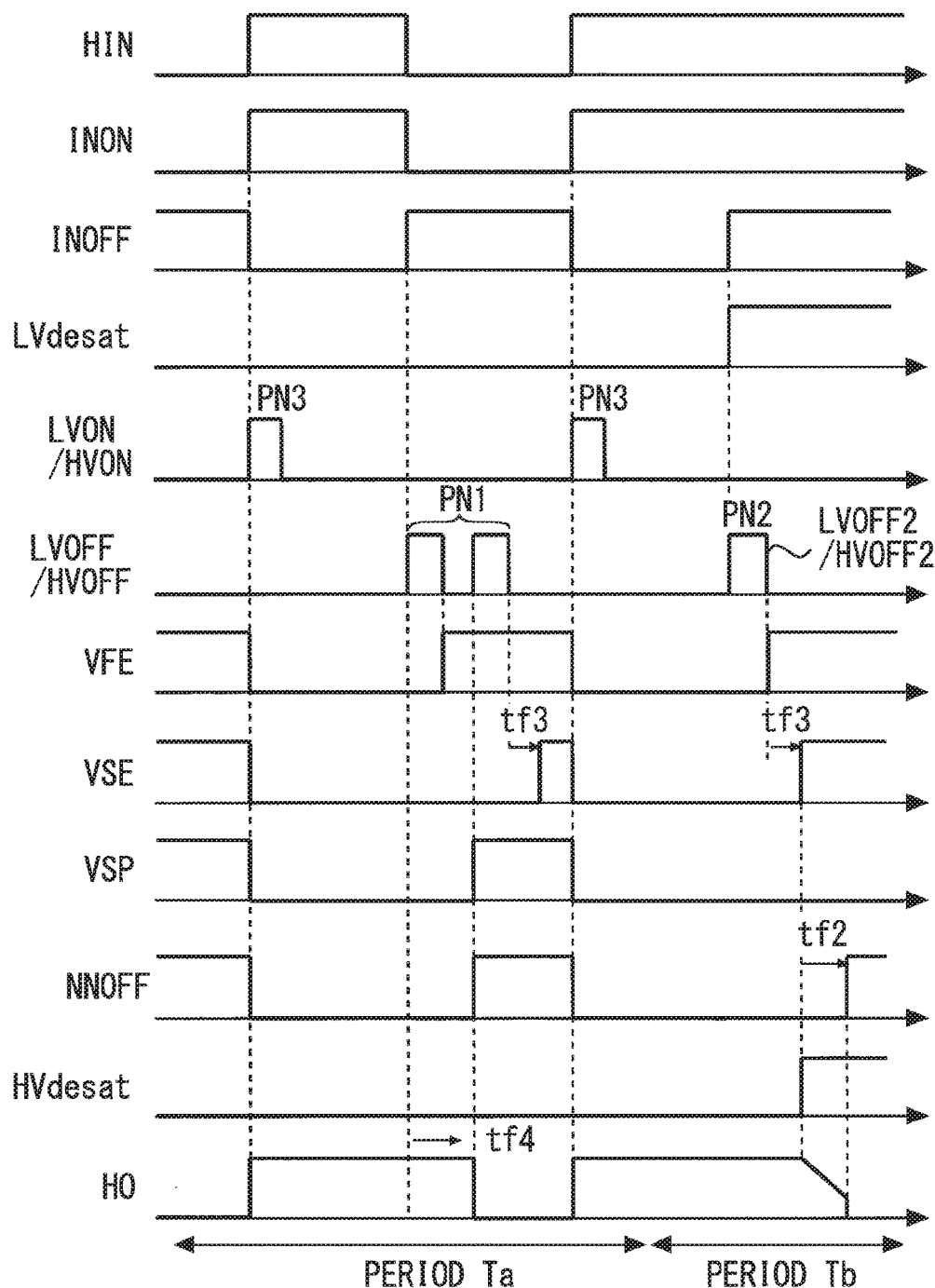
FIG. 10 is a time chart illustrating an operation of the semiconductor device driving integrated circuit according to the third embodiment of the present invention.

FIG. 10 is a time chart illustrating an operation of the semiconductor device driving integrated circuit 101b according to the third embodiment of the present invention. The period Ta illustrates a sequence during the normal operation. The period Tb illustrates the case where the unsaturated voltage is detected when the input signal HIN is high.

In the period Ta, the signal LYON rises as the pulse signal having the third pulse number PN3 in synchronization with a rising edge of the input signal HIN, and the drive signal HO rises in synchronization with a rising edge of the signal HVON. When the signal LVOFF rises as the pulse signal having the first pulse number PN1 in synchronization with a falling edge of the input signal HIN, the signal VFE rises in synchronization with a falling edge of the first pulse of the signal HVOFF, and the signal VSP rises in synchronization with a rising edge of the second pulse of the signal HVOFF. On the other hand, the signal VSE rises after a lapse of the delay time tf3 from a falling edge of the second pulse. Since the signal VSP rises prior to the signal VSE, the signal NNOFF rises in synchronization with a rising edge of the signal VSP and the high-potential error signal HVdesat is not generated. Accordingly, the drive signal HO rapidly falls as usual in synchronization with a rising edge of the signal NNOFF, and the high-potential-side semiconductor switching element 102 is rapidly shut down.

In the period Tb, the low-potential error signal LVdesat rises when the unsaturated voltage is detected. The signal INOFF rises in synchronization with a rising edge of the low-potential error signal LVdesat, and the signal LVOFF rises as the pulse signal having the second pulse number PN2 in synchronization with a rising edge of the signal INOFF. The signal VFE rises in synchronization with a falling edge of the first pulse of the signal HVOFF, but does not have second and subsequent pulses, so that the signal VSP is not generated. On the other hand, the signal VSE rises after a lapse of the delay time tf3 from a falling edge of the first pulse, and the high-potential error signal HVdesat rises in synchronization with a rising edge of the signal VSE. The signal NNOFF rises after a lapse of the delay time tf2 from a rising edge of the signal VSE.

The drive signal HO slowly falls in synchronization with a rising edge of the high-potential error signal HVdesat, and falls in synchronization with a rising edge of the signal NNOFF. Through this operation, soft shutdown can be achieved when the high-potential-side semiconductor switching element 102 is short-circuited.

Note that the third embodiment illustrates a specific example in which the number of pulses when the low-potential error signal LVdesat is low is two and the number of pulses when the low-potential error signal LVdesat is high is one. However, as a modified example, the off-pulse number adjustment circuit 216 and the off-pulse number determination circuit 217 may be modified in such a manner that the number of pulses when the low-potential error signal LVdesat is high is set to be larger than the number of pulses when the low-potential error signal LVdesat is low. For example, the number of pulses when the low-potential error signal LVdesat is low may be one and the number of pulses when the low-potential error signal LVdesat is high may be two.

REFERENCE SIGNS LIST 101, 101a, 101b semiconductor device driving integrated circuit (integrated circuit)
102 high-potential-side semiconductor switching element
103 low-potential-side semiconductor switching element
110 main signal transmission circuit
111 primary-side signal transmission circuit
112, 112a, 112b primary-side circuit
113 first level shift main circuit
114 secondary-side signal transmission circuit
115, 115a, 115b secondary-side circuit
118 second level shift main circuit
119 soft shutdown circuit
121 unsaturated voltage detection circuit
201 input logic circuit
211 On-pulse generation circuit
212 Off-pulse generation circuit
213 Off-pulse width adjustment circuit 214 Off-pulse width determination circuit
215, 218 Off-pulse generation unit
216 off-pulse number adjustment circuit
217 off-pulse number determination circuit
301 PMOS transistor
302 capacitative element
303, 304, 308, 314, 403, 416 NOT circuit
305, 316, 406, 415 OR circuit
306 CMOS inverter circuit
307, 315, 404, 417 AND circuit
311 falling edge detection circuit
312 pulse width detection circuit
313 filter circuit
401 first one-shot pulse generation circuit
402 second one-shot pulse generation circuit
405 delay circuit
411 first pulse falling edge detection circuit
412 second pulse rising edge detection circuit
413 second pulse falling edge detection circuit
414 filter circuit
600 high-potential-side drive circuit (HVIC)
700 low-potential-side drive circuit (LVIC)
800 drive module
900 semiconductor device (inverter device)

The invention claimed is:

1. A semiconductor device driving circuit comprising:
a signal transmission circuit including a first level shift circuit configured to level-shift an input signal having a first voltage level, the signal transmission circuit being configured to generate a drive signal having a second voltage level higher than the first voltage level based on the input signal; and
an unsaturated voltage detection circuit configured to output a first error signal having the first voltage level when an unsaturated voltage of a semiconductor switching element driven by the drive signal is detected,
wherein a second error signal having the second voltage level is generated by level-shifting the first error signal, or by a signal obtained by level-shifting a converted signal converted into a pulse signal from the first error signal, and
wherein the semiconductor device driving circuit further comprises a soft shutdown circuit configured to change a drive signal for the semiconductor switching element to softly shut down the semiconductor switching element when the second error signal is input.

2. The semiconductor device driving circuit according to claim 1, comprising a second level shift circuit,
wherein the first error signal is level-shifted by the second level shift circuit to generate the second error signal.

3. The semiconductor device driving circuit according to claim 1, wherein the converted signal is input to the first level shift circuit and the second error signal is generated based on the signal obtained by level-shifting the converted signal by the first level shift circuit.

4. The semiconductor device driving circuit according to claim 3, wherein
the signal transmission circuit includes a primary-side signal transmission circuit provided at a pre-stage of the first level shift circuit, and a secondary-side signal transmission circuit provided at a subsequent stage of the first level shift circuit,
the primary-side signal transmission circuit generates a first on-pulse signal having the first voltage level in response to a rising edge of the input signal, and generates a first off-pulse signal having the first voltage level in response to a falling edge of the input signal,
the first level shift circuit level-shifts the first on-pulse signal to generate a second on-pulse signal having the second voltage level, and level-shifts the first off-pulse signal to generate a second off-pulse signal having the second voltage level,
the secondary-side signal transmission circuit generates, as the drive signal, a pulse signal that rises in response to an input of the second on-pulse signal and falls in response to an input of the second off-pulse signal,
the converted signal has a pulse width different from the pulse width of the first off-pulse signal,
the converted signal is input to the first level shift circuit in place of the first off-pulse signal, and
the second error signal is generated based on the signal obtained by level-shifting the converted signal by the first level shift circuit.

5. The semiconductor device driving circuit according to claim 3, wherein
the signal transmission circuit includes a primary-side signal transmission circuit provided at a pre-stage of the first level shift circuit, and a secondary-side signal transmission circuit provided at a subsequent stage of the first level shift circuit,
the primary-side signal transmission circuit generates a first on-pulse signal having the first voltage level in response to a rising edge of the input signal, and generates a first off-pulse signal having the first voltage level in response to a falling edge of the input signal,
the first level shift circuit level-shifts the first on-pulse signal to generate a second on-pulse signal having the second voltage level, and level-shifts the first off-pulse signal to generate a second off-pulse signal having the second voltage level,
the secondary-side signal transmission circuit generates, as the drive signal, a pulse signal that rises in response to an input of the second on-pulse signal and falls in response to an input of the second off-pulse signal,
the number of pulses per output of the converted signal is different from that of the first off-pulse signal,
the converted signal is input to the first level shift circuit in place of the first off-pulse signal, and
the second error signal is generated based on the signal obtained by level-shifting the converted signal by the first level shift circuit.

* * * * *